United States Patent [19]

Eisenstatt et al.

[11] Patent Number: 4,560,575
[45] Date of Patent: Dec. 24, 1985

[54] METHOD FOR COATING A NUCLEAR FUEL WITH BORON NITRIDE

[75] Inventors: Larry R. Eisenstatt, Orchard Park, N.Y.; Kenneth C. Radford, Irwin, Pa.

[73] Assignee: Westinghouse Electric Corp., Pittsburgh, Pa.

[21] Appl. No.: 564,057

[22] Filed: Dec. 21, 1983

[51] Int. Cl.⁴ .................................................. G21C 3/06
[52] U.S. Cl. ..................................... 427/6; 427/255.2; 376/414; 376/411; 376/419
[58] Field of Search ....................... 376/419, 411, 414; 427/6, 255.2

[56] References Cited

U.S. PATENT DOCUMENTS

| | | | |
|---|---|---|---|
| 3,427,222 | 2/1969 | Biancheria | 376/419 |
| 3,564,565 | 2/1971 | Haberecht | 376/419 |
| 3,625,821 | 12/1971 | Ricks | 376/419 |
| 4,123,326 | 10/1978 | Shinbo | 376/419 |

Primary Examiner—Sam Silverberg
Attorney, Agent, or Firm—R. D. Fuerle

[57] ABSTRACT

A method of applying a burnable absorber coating on a nuclear fuel pellet comprising the step of exposing the nuclear fuel pellet to a gas stream of boron trichloride and anhydrous ammonia at a temperature of from about 600°–800° C. A coating of boron nitride is formed as a reaction product of boron trichloride with anhydrous ammonia on the fuel pellet.

12 Claims, No Drawings

METHOD FOR COATING A NUCLEAR FUEL WITH BORON NITRIDE

BACKGROUND OF THE INVENTION

The present invention relates generally to a process of coating a nuclear fuel with a burnable absorber, also referred to as a burnable poison, and more particularly, to an improved process of coating a nuclear fuel using chemical vapor deposition techniques with boron nitride material acting as a burnable absorber.

It is known that nuclear fuel may have various shapes such as plates, columns, and even fuel pellets disposed in end-to-end abutment within a tube or cladding made of zirconium alloy or stainless steel. The fuel pellets contain fissionable material, such as uranium dioxide, thorium dioxide, plutonium dioxide, or mixtures thereof. The fuel rods are usually grouped together to form a fuel assembly. The fuel assemblies are arranged together to constitute the core of a nuclear reactor.

It is well known that the process of nuclear fission involves the disintegration of the fissionable nuclear fuel material in the nuclear core into two or more fission products of lower mass number. Among other things, the process also includes a net increase in the number of available free neutrons which are the basis for a self-sustaining reaction. When a reactor has operated over a period of time, the fuel assembly with fissionable material must ultimately be replaced due to depletion. Inasmuch as the process of replacement is time consuming and costly, it is desirable to extend the life of a given fuel assembly as long as practically feasible. For that reason, deliberate additions to the reactor fuel of parasitic neutron-capturing elements in calculated small amounts may lead to highly beneficial effects on a thermal reactor. Such neutron-capturing elements are usually designated as "burnable absorbers" if they have a high probability or cross-section for absorbing neutrons while producing no new or additional neutrons or changing into new absorbers as a result of neutron absorption. During reactor operation, the burnable absorbers are progressively reduced in amount so that there is a compensation made with respect to the concomitant reduction in the fissionable material.

The life of a fuel assembly may be extended by combining an initially larger amount of fissionable material, as well as a calculated amount of burnable absorber. During the early stages of operation of such a fuel assembly, excessive neutrons are absorbed by the burnable absorber which undergoes transformation to elements of low neutron cross-section which do not substantially affect the reactivity of the fuel assembly in the latter period of its life, when the availability of fissionable material is lower. The burnable absorber compensates for the larger amount of fissionable material during the early life of the fuel assembly, but progressively less absorber captures neutrons during the latter life of the fuel assembly, so that a long life at relatively constant fission level is assured for the fuel assembly. Accordingly, with a fuel assembly containing both fuel and burnable absorber in carefully proportioned quantity, an extended fuel assembly life can be achieved with relatively constant neutron production and reactivity. Burnable absorbers which may be used include boron, gadolinium, samarium, europium, and the like, which upon the absorption of neutrons result in isotopes of sufficiently low neutron capture cross-section so as to be substantially transparent to neutrons.

The incorporation of burnable absorbers in fuel assemblies has thus been recognized in the nuclear field as an effective means of increasing fissionable material capacity and thereby extending reactor core life. Burnable absorbers are used either uniformly mixed with the fuel, i.e., distributed absorber, are coated onto the nuclear fuel or are placed discretely as separate elements in the reactor core. Thus the net reactivity of the core is maintained relatively constant over the active life of the core.

Boron nitride coatings have been found to be the most desirable coatings for fuel pellets, based upon the coatings' adherency and boron nitride's expansion coefficient being closest to that of uranium dioxide; however, attempts to coat a fuel pellet with boron nitride have been quite unsuccessful. Techniques such as sputtering, ion plating, plasma spraying, and chemical vapor deposition have been attempted. It has been found that by using the techniques of sputtering or ion plating, although a coating can be achieved, the rate of deposition of boron nitride is extremely slow. The extremely slow deposition rate results in such processes being extremely expensive and commercially undesirable, since each of the processes require high voltage power supplies and high vacuum chambers. With respect to plasma spraying of a boron nitride coating on a uranium dioxide pellet, it has been found that control of deposition of the coating has been extremely difficult. Additionally, chemical bond splitting of the boron and nitrogen atom has been observed at the temperatures required for plasma spraying, resulting in the stoichiometric ratio of coating being unbalanced in that the uranium dioxide pellet is coated with generally boron alone. Finally, attempts at chemical vapor depositing a boron nitride coating on a uranium dioxide fuel pellet have proven to be unsuccessful since the reaction between boron trichloride ($BCl_3$) and ammonia ($NH_3$) requires temperatures greater than 1000° C. At such high temperatures the HCL by-product produced during the reaction between $BCl_3$ and $NH_3$ causes severe problems in that the uranium dioxide fuel pellet decomposes due to the corrosive action of the HCL on the $UO_2$ pellet at these temperatures.

There is disclosed a method for coating of elemental boron in U.S. Pat. No. 3,427,222, wherein a uranium dioxide fuel pellet substrate is coated with the burnable absorber boron applied by chemical vapor deposition at a temperature greater than 800° C. The coating is achieved by the thermal reduction of boron trichloride in the presence of hydrogen. It is noted that the deposition rate at temperatures below 800° C. is relatively slow, whereas a boron coating formed at process temperatures above 1000° C. is not as adherent.

Accordingly, it can be appreciated that there is an unsolved need for a method for applying a boron nitride coating to be used as as burnable absorber into a nuclear fuel pellet which is commercially desirable, relatively inexpensive, and not harmful to the fuel pellet itself.

SUMMARY OF THE INVENTION

An object of the present invention is to provide a method for coating a nuclear fuel of fissionable material with a burnable absorber.

Another object of the present invention is to provide a method for coating a nuclear fuel in which boron nitride is incorporated to function as the burnable absorber.

Yet another object of the present invention is to provide a method for coating a nuclear fuel with boron nitride that is simple and economical.

Still yet another object of the present invention is to provide a method for coating a nuclear fuel with a boron nitride burnable absorber on a uranium dioxide fuel pellet, which coating has a controlled thickness.

A further object of the present invention is to provide a method for coating a nuclear fuel with a boron nitride burnable absorber at low temperature by chemical vapor deposition.

These and other objects of the present invention are achieved by a method of applying a burnable absorber coating on nuclear fuel comprising the step of exposing the nuclear fuel to a gas stream of boron trichloride and anhydrous ammonia at a temperature of from about 600°–800° C., whereby a coating of boron nitride is formed as a reaction product on the fuel.

DETAILED DESCRIPTION OF THE INVENTION

Boron nitride has been found to be an excellent burnable absorber based on its cross sectional properties and the harmless by-products resulting from fission upon irradiation by thermal neutrons. Additionally, since the theoretical density of boron nitride approaches that of uranium dioxide, a thin coating in the range of 0.25 to 0.75 mils is highly satisfactory and suitable for use as a burnable absorber coating.

The formation of boron nitride is accomplished by the following chemical reaction:

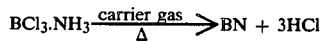

$$BCl_3 \cdot NH_3 \xrightarrow[\Delta]{\text{carrier gas}} BN + 3HCl$$

The temperature necessary to achieve this reaction, as taught in the prior art, are from 900° to 1800° C. since this reaction is kinetically one of thermal reduction. When performing chemical vapor deposition on a uranium dioxide fuel pellet at these temperatures, it has been found that the hydrochloric acid (HCl) reacts readily with the uranium dioxide ($UO_2$) to form a volatile uranium species resulting in deterioration of the fuel pellet with a concomitant loss in weight. The reaction of HCl and $UO_2$ is temperature dependent, in that the greater the temperature, the greater the corrosive effect of the hydrochloric acid. Upon lowering the chemical vapor deposition temperature to between 900°–1100° C. to alleviate the corrosive effect of the hydrochloric acid, rather than getting a uniform coating of boron nitride on the uranium dioxide fuel pellet, the reduction of temperature results in the formation of a fluffy, white powder deposit of $NH_4Cl$, which is indicative of gas phase nucleation of the $BCl_3$ and the $NH_3$ and a less-than-satisfactory coating of boron nitride.

The present invention has overcome both of these problems through the application of a boron nitride coating on a fuel pellet, such as uranium dioxide, thorium dioxide, plutonium dioxide, or mixtures thereof, by chemical vapor deposition at temperatures of between 600°–800° C. At the lower temperatures, the formation of boron nitride (BN) is achieved solely through a chemical reaction between the reactants, $BCl_3$ and $NH_3$, and not by a thermal reduction or activation of the reactants as previously described. This result arises out of the possible fact that the uranium dioxide is acting as a catalyst to assist and speed the reaction by breaking down the $BCl_3$.

To practice the method of the present invention, the boron trichloride gas should attain a 99.9% minimum purity and be formed of $B^{10}$ isotope or a mixture of the $B^{10}$ and $B^{11}$ isotopes. The ammonia ($NH_3$) gas is anhydrous $NH_3$, having a purity of 99.99%. The non-reactant carrier gas should have a 99.998% minimum purity and can be hydrogen ($H_2$) or any of the Group VIII elemental gases, such as helium (He), argon (Ar), neon (Ne), Krypton (Kr), or xenon (Xe), or any combination of the same. The primary purpose of the carrier gas in the method of the present invention is to purely reduce the partial pressure of oxygen in the reactive chamber of a furnace to prevent the formation of water and to dilute the reactive gaseous species.

The chemical vapor deposition can be carried out in either a molybdenum wound furnace, a quartz furnace, a stainless steel furnace, or the like, wherein the furnace has the capability of maintaining temperature stabilization. Additionally, the chemical vapor deposition is carried out at atmospheric pressure, eliminating the need for a high vacuum chamber as required for ionplating or sputtering.

The nuclear fuel to be coated using the method of the present invention includes uranium, thorium, or plutonium in the form of uranium dioxide, thorium dioxide, or plutonium dioxide pellets. The fuel pellets are generally cylindrical in configuration with an approximately one-third inch diameter and an approximately one-half inch length. At the start of the procedure the fuel pellets are loaded into a graphite boat in an end-to-end arrangement wherein only one half of the pellet is exposed. The graphite boat with the loaded pellets is then transported into the reactive chamber. This procedure allows one side of the pellet to be coated at a time. Accordingly, after a first run, the pellets are repositioned in the graphite boat for a second run to coat the remaining surface. Alternatively, by using the method of the present invention, chemical vapor deposition of boron nitride at between 600°–800° C. does not coat in line of sight; therefore, the pellets can be suspended on a screen in the furnace to achieve a total coating during one operation.

During the chemical vapor deposition, the temperature of the furnace is to be maintained between 600° to 800° C. and optimally, around, at, or just above 600° C. By maintaining this temperature, the kinetic rate of the HCl acting on the fuel pellet is markedly reduced thereby preventing deterioration of the fuel pellet. Further, it has been observed that at these temperatures, the formation of boron nitride and the subsequent deposition on the fuel pellet is at a kinetically favorable rate. This factor of a kinetically favorable rate for the deposition of a boron nitride coating is quite important since the method of coating must be controllable so as to produce a thin but effective coating of burnable absorber. The coating thickness must be kept to a minimum to avoid a reduction in fuel inventory. As previously described, boron nitride coatings serve this function.

Following temperature stabilization of the reactive chamber in the furnace and the pellets themselves, the reactive gases ($BCl_3$ and $NH_3$) and the carrier gas are introduced into the chamber through pressure nozzles at desired flow rates. The volume ratio of the flow rate of the anhydrous $NH_3$ gas to the boron trichloride gas can be from 1:1 up to 5:1, with the preferable ratio being 5:1, ammonia gas to boron trichloride. The flow rate of the carrier gas with respect to the boron trichloride gas can be at a volume ratio of 500:1 to 1500:1, with the preferable ratio being approximately 1000:1, carrier gas to boron trichloride.

Speed of deposition, and therefore time of coating, is directly dependent upon the flow rates of the reactive gases and the temperature at which chemical vapor deposition is carried out such that, as the flow rate of the reactive gases increases, the temperature of the reactive chamber can decrease. The desired coating thickness of boron nitride is between 0.25 to 0.75 mils and preferably 0.5 mils. To achieve such a thickness, the flow rate of boron trichloride is in the range of from 2 to 5 cm$^3$/min, and the flow rate of anhydrous ammonia is in the range of from 10 to 25 cm$^3$/min, with the temperature of reaction being between 600°–650° C. Using these parameters, the dwell time of the fuel pellets in a production capacity reactive chamber is expected to be between 15 to 30 minutes.

By utilizing the process in accordance with the present invention, it has been found that there is excellent adhesion of the boron nitride coating on the fuel pellet substrate and a quantitative analysis of the coating has shown it to be uniform with the ratio of boron to nitrogen being 1:1. Further, it has been found that the boron nitride coating resists a peel test, and there was no development of cracking of the coating during thermal cycling.

A further advantage of using a boron nitride coating on a nuclear fuel pellet arises, in that the boron nitride coating has a layer type crystal structure and serves as an excellent lubricant to allow slight movement between the pellets when loaded into a nuclear fuel rod. This prevents interference and possible binding to the cladding during a nuclear reaction which overcomes problems of corrosion and cracking of the nuclear rod.

The following example is illustrative of an embodiment of this invention.

EXAMPLE

A coating of the required thickness is obtained utilizing the method of the present invention through chemical vapor deposition by subjecting heated fuel pellets to an atmosphere of boron trichloride and anhydrous ammonia in the presence of a carrier gas comprised of hydrogen and argon. The uranium dioxide fuel pellets are placed in an end-to-end relationship in a graphite boat and are inserted into a stainless steel laboratory furnace. The furnace is heated to a temperature of 700° C. Following temperature stabilization, the reactive gases, boron trichloride and anhydrous ammonium, and the carrier gas, the mixture of argon and hydrogen, are introduced into the reactive chamber. The flow rates of the gases are as follows: for the boron trichloride, 2.5 cm$^3$/min; for the anhydrous ammonia, 12.5 cm$^3$/min; for the hydrogen, 2000 cm$^3$/min; and for the argon, 650 cm$^3$/min. At these flow rates a 0.5 mil coating of boron nitride is accomplished in approximately 3 to 18 hours. Upon performing a quantitative analysis of the coating on the pellets, the boron to nitrogen ratio if 1:1, and the coating is uniform. The B$^{10}$ loading on the uranium dioxide fuel pellet is $5.98 \times 10^{-4}$ g/cm with the boron density being 0.96 g/cm$^3$. Further, the boron nitride coating is found to have excellent adhesion properties to the uranium dioxide pellet and does not develop cracking upon thermal cycling.

Numerous modifications and variations of the above-disclosed invention are possible in light of the above teaching and, therefore, within the scope of the appended claims, the invention may be practiced; otherwise, then as particularly described.

What is claimed:

1. A method of applying a burnable absorber coating on nuclear fuel comprising uranium dioxide comprising the step of exposing said nuclear fuel in a reaction chamber to a gas stream of boron trichloride and anhydrous ammonia at a temperature of from about 600°–800° C. whereby a coating of boron nitride is formed as a reaction product on said fuel.

2. The method of applying a burnable absorber coating on nuclear fuel as defined in claim 1 wherein said boron trichloride (BCL$_3$) is formed of a B$^{10}$ isotope.

3. The method of applying a burnable absorber coating on nuclear fuel as defined in claim 1 wherein said boron trichloride (BCl$_3$) is formed of a mixture of B$^{10}$ and B$^{11}$ isotopes.

4. The method of applying a burnable absorber coating on nuclear fuel as defined in claim 2 wherein the temperature of vapor deposition is substantially equal to 600° C.

5. The method of applying a burnable absorber coating on nuclear fuel as defined in claim 1 wherein said boron trichloride is introduced into said chamber at a flow rate of about 2 to about 5 cm$^3$/min and said ammonia is introduced into said chamber at a flow rate of about 10 to about 25 cm$^3$/min.

6. The method of applying a burnable absorber coating on nuclear fuel pellet as defined in claim 1 wherein said vapor deposition is carried out in the presence of a carrier gas.

7. The method of applying a burnable absorber coating on nuclear fuel as defined in claim 6 wherein said carrier gas is selected from the group consisting of hydrogen, helium, argon, neon, xenon, krypton, and mixtures thereof.

8. The method of applying a burnable absorber coating on nuclear fuel as defined in claim 8 wherein said nuclear fuel is in the form of a pellet.

9. The method of applying a burnable absorber coating on nuclear fuel as defined in claim 1 wherein said nuclear fuel is loaded in graphite boats and exposed to said gas stream in said reaction chamber.

10. The method of applying a burnable absorber coating on nuclear fuel as defined in claim 1 wherein said nuclear fuel is suspended in said reaction chamber and exposed to said gas stream.

11. The method of applying a burnable absorber coating on nuclear fuel as defined in claim 1 wherein said gas stream is comprised of said boron trichloride and said anhydrous ammonia in a 1:1 ratio.

12. The method of applying a burnable absorber coating on nuclear fuel as defined in claim 1 wherein said gas stream is said boron trichloride and said anhydrous ammonia in a 1:5 ratio.

* * * * *